United States Patent
Liang et al.

(10) Patent No.: US 12,336,355 B2
(45) Date of Patent: *Jun. 17, 2025

(54) DISPLAY BACKBOARD AND MANUFACTURING METHOD THEREOF AND DISPLAY DEVICE

(71) Applicant: BOE Technology Group Co., Ltd., Beijing (CN)

(72) Inventors: Zhiwei Liang, Beijing (CN); Yingwei Liu, Beijing (CN); Zhijun Lv, Beijing (CN); Ke Wang, Beijing (CN); Zhanfeng Cao, Beijing (CN); Hsuanwei Mai, Beijing (CN); Guangcai Yuan, Beijing (CN); Muxin Di, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/228,281

(22) Filed: Jul. 31, 2023

(65) Prior Publication Data
US 2023/0378414 A1   Nov. 23, 2023

Related U.S. Application Data

(63) Continuation of application No. 16/982,217, filed as application No. PCT/CN2019/126708 on Dec. 19, 2019, now Pat. No. 11,764,343.

(51) Int. Cl.
*H10H 20/857* (2025.01)
*H01L 23/00* (2006.01)
(Continued)

(52) U.S. Cl.
CPC ........... *H10H 20/857* (2025.01); *H01L 24/03* (2013.01); *H01L 24/05* (2013.01);
(Continued)

(58) Field of Classification Search
None
See application file for complete search history.

(56) References Cited

U.S. PATENT DOCUMENTS 10,325,894 B1    6/2019  Pan
11,764,343 B2 *  9/2023  Liang ................ H01L 24/13
                                                257/89
(Continued)

FOREIGN PATENT DOCUMENTS

CN    2000-183507 A    6/2000
CN      101656216 A    2/2010
(Continued)

OTHER PUBLICATIONS

United States of America Notice of Allowance dated May 3, 2023 corresponding to U.S. Appl. No. 16/982,217.
(Continued)

*Primary Examiner* — Feifei Yeung Lopez
(74) *Attorney, Agent, or Firm* — Nath, Goldberg & Meyer; Joshua B. Goldberg

(57) ABSTRACT

A display backboard and a manufacturing method thereof, and a display device are provided. The display backboard includes: a driving substrate; a plurality of driving electrodes on the driving substrate; and a plurality of connection structures respectively on the plurality of driving electrodes. The connection structure includes: at least one conductive component on the driving electrode; and a restriction component on a side of the driving electrodes provided with the at least one conductive component and in at least a part of a peripheral region of the at least one conductive component. The restriction component protrudes from the driving electrode and has a first height in a direction perpendicular to the driving substrate.

19 Claims, 15 Drawing Sheets

(51) Int. Cl.
*H01L 25/075* (2006.01)
*H10H 20/01* (2025.01)

(52) U.S. Cl.
CPC ............ *H01L 25/0753* (2013.01); *H01L 2224/02166* (2013.01); *H01L 2224/02185* (2013.01); *H01L 2224/0219* (2013.01); *H01L 2224/03013* (2013.01); *H01L 2224/03462* (2013.01); *H01L 2224/03614* (2013.01); *H01L 2224/03622* (2013.01); *H01L 2224/0401* (2013.01); *H01L 2224/05017* (2013.01); *H01L 2224/05124* (2013.01); *H01L 2224/05147* (2013.01); *H01L 2224/05155* (2013.01); *H01L 2224/0518* (2013.01); *H10H 20/0364* (2025.01)

(56) References Cited

U.S. PATENT DOCUMENTS

| | | | |
|---|---|---|---|
| 2008/0017873 | A1 | 1/2008 | Tomoda et al. |
| 2009/0183911 | A1 | 7/2009 | Sunohara et al. |
| 2010/0044416 | A1 | 2/2010 | Ogawa |
| 2010/0140805 | A1 | 6/2010 | Chang et al. |
| 2011/0084386 | A1 | 4/2011 | Pendse |
| 2011/0140271 | A1 | 6/2011 | Daubenspeck et al. |
| 2012/0217640 | A1 | 8/2012 | Choi et al. |
| 2013/0207239 | A1 | 8/2013 | Yu et al. |
| 2016/0293565 | A1 | 10/2016 | Choi |
| 2017/0048976 | A1 | 2/2017 | Prevatte et al. |
| 2017/0287789 | A1 | 10/2017 | Bower et al. |
| 2018/0042110 | A1 | 2/2018 | Cok |
| 2018/0175268 | A1 | 6/2018 | Moon et al. |
| 2018/0182740 | A1 | 6/2018 | Kim et al. |
| 2018/0247584 | A1 | 8/2018 | Chen |
| 2019/0006559 | A1 | 1/2019 | Lai et al. |
| 2019/0051672 | A1 | 2/2019 | Lee et al. |
| 2019/0157532 | A1 | 5/2019 | Meitl et al. |
| 2020/0028044 | A1* | 1/2020 | Lee .............. H01L 25/0753 |

FOREIGN PATENT DOCUMENTS

| | | |
|---|---|---|
| CN | 101752336 A | 6/2010 |
| CN | 103117246 A | 5/2013 |
| CN | 103247587 A | 8/2013 |
| CN | 106486493 A | 3/2017 |
| CN | 106876552 A | 6/2017 |
| CN | 108183156 A | 6/2018 |
| CN | 108206234 A | 6/2018 |
| CN | 108493154 A | 9/2018 |
| CN | 108933153 A | 12/2018 |
| CN | 109285856 A | 1/2019 |
| CN | 109494292 A | 3/2019 |
| CN | 109755376 A | 5/2019 |
| CN | 109887950 A | 6/2019 |
| CN | 109950270 A | 6/2019 |
| CN | 110047866 A | 7/2019 |
| CN | 110061106 A | 7/2019 |
| CN | 110100309 A | 8/2019 |
| JP | 2002289770 A | 10/2002 |
| JP | 2008027933 A | 2/2008 |
| JP | 2010103161 A | 5/2010 |
| JP | 2016021446 A | 2/2016 |
| JP | 2017228585 A | 12/2017 |
| JP | 2018101785 A | 6/2018 |
| JP | 2018107421 A | 7/2018 |
| JP | 2019507904 A | 3/2019 |
| JP | 2019079985 A | 5/2019 |
| JP | 2019514075 A | 5/2019 |
| TW | 201826517 A | 7/2018 |
| WO | 2013001225 A1 | 1/2013 |
| WO | 2017149521 A1 | 9/2017 |
| WO | 2018111752 A1 | 6/2018 |

OTHER PUBLICATIONS

Office Action dated Jan. 7, 2022 issued in corresponding Indian Application No. 202027053422.
International Search Report dated Feb. 5, 2020 corresponding to application No. PCT/CN2019/089543.
International Search Report dated May 21, 2020 corresponding to application No. PCT/CN2019/100920.
Extended Search Report issued in European Application No. 19932246.2 dated Jul. 20, 2022.
First Office Action issued on Apr. 20, 2022 for U.S. Appl. No. 16/765,530.
First Office Action issued on May 10, 2022 for U.S. Appl. No. 16/959,097.
First Office Action issued on Jun. 8, 2022 for application No. CN201980000782.X with English translation attached.
First Office Action issued on Mar. 29, 2022 for application No. IN202027053419.
First Office Action issued on Apr. 1, 2022 for application No. CN201980001362.3 with English translation attached.
International Search Report dated Mar. 13, 2020 corresponding to application No. PCT/CN2019/126708.
Notice of Allowance dated Feb. 7, 2023 corresponding to U.S. Appl. No. 16/765,530.
Restriction Requirement dated Nov. 29, 2021 corresponding to U.S. Appl. No. 16/765,530.
Second Office Action dated Oct. 20, 2022 corresponding to U.S. Appl. No. 16/765,530.
Final Office Action dated Sep. 1, 2022 corresponding to U.S. Appl. No. 16/959,097.
Notice of Allowance dated Nov. 18, 2022 corresponding to U.S. Appl. No. 16/959,097.
Extended Search Report issued in European Application No. 19931464.2 dated May 12, 2023.
Notice of Reasons for Refusal dated Apr. 25, 2023 corresponding to Japanese application No. 2020-570165.
Notice of Reasons for Refusal dated Apr. 25, 2023 corresponding to Japanese application No. 2020-570027.

* cited by examiner

DISPLAY BACKBOARD AND MANUFACTURING METHOD THEREOF AND DISPLAY DEVICE

CROSS-REFERENCE TO RELATED APPLICATIONS

This application is a continuation application of U.S. patent application Ser. No. 16/982,217, which is a national phase of PCT/CN2019/126708 filed on Dec. 19, 2019, which claims priorities of International Application No. PCT/CN2019/089543 filed on May 31, 2019 and International Application No. PCT/CN2019/100920 filed on Aug. 16, 2019, the entire disclosures of which are incorporated herein by reference.

TECHNICAL FIELD

The disclosure relates to the field of display technology, and in particular relates to a display backboard and a manufacturing method thereof, and a display device.

BACKGROUND

A Micro-Light Emitting Diode (abbreviated as Micro-LED or μLED) display technology is used to reduce a size of an existing LED to be less than 100 μm, which has a size of about 1% of that of the existing LED. The micron-sized Micro-LEDs of RGB three-colors are transferred to a driving substrate by a mass transfer technology, such that Micro-LED displays with various sizes are manufactured.

Each Micro-LED pixel can be addressed and independently driven to emit light, and a distance between adjacent pixels is reduced from millimeter level to micrometer level. The Micro-LED has the advantages of self-luminescence, high brightness, high contrast, ultrahigh resolution and color saturation, long service life, high response speed, energy conservation, wide application range in environment and the like. The Micro-LED display technology can cover a range from micro display such as Augmented Reality (abbreviated as AR) or Virtual Reality (abbreviated as VR), medium-sized display such as mobile phone and television, to large-screen display in cinema.

SUMMARY

In one aspect, a display backboard is provided to include: a driving substrate; a plurality of driving electrodes on the driving substrate; a plurality of connection structures on the plurality of driving electrodes respectively, an orthographic projection of each of the plurality of connection structures on the driving substrate being within an orthographic projection of a corresponding driving electrode on the driving substrate, wherein the connecting structure includes: at least one conductive component on the driving electrode, wherein an area of a first cross-section of the at least one conductive component is negatively correlated to a distance between the first cross-section and a surface of the driving substrate, and the first cross-section is parallel to the surface of the driving substrate; and a restriction component on a side of the driving electrode provided with the at least one conductive component and at least in a part of a peripheral region of the at least one conductive component, wherein the restriction component protrudes from the driving electrode and has a first height in a direction perpendicular to the driving substrate.

In some embodiments, a difference between the first height and a second height of the at least one conductive component in a direction perpendicular to the driving substrate is in a range of about 0 microns to about 1.5 microns.

In some embodiments, the restriction component is made of a conductive material.

In some embodiments, the at least one conductive component is spaced from the restriction component.

In some embodiments, the connection structure further includes a conductive connection component on the driving electrode and between the at least one conductive component and the restriction component.

In some embodiments, each of the at least one conductive component includes a main body on the driving electrode and a conductive layer covering an entire surface of the main body; and the conductive connection component, the restriction component, and the conductive layer are made of a same conductive material.

In some embodiments, each of the at least one conductive component includes a main body on the driving electrode and a conductive layer covering the entire surface of the main body except for a part of the surface of the main body distal to the driving electrode; and the conductive connection component, the restriction component, and the conductive layer are made of a same conductive material.

In some embodiments, the at least one conductive component is in direct contact with the restriction component on a surface of the driving electrode.

In some embodiments, each of the at least one conductive component includes a main body on the driving electrode and a conductive layer covering an entire surface of the main body; and the restriction component and the conductive layer are made of a same conductive material.

In some embodiments, each of the at least one conductive component includes a main body on the driving electrode and a conductive layer covering an entire surface of the main body except for a part of the surface of the main body distal to the driving electrode; and the restriction component and the conductive layer are made of a same conductive material.

In some embodiments, a height of the conductive layer in a direction perpendicular to the driving substrate is approximately equal to a height of the restriction component in the direction perpendicular to the driving substrate.

In some embodiments, a material of the main body is copper, aluminum, or nickel, and a material of the conductive layer is molybdenum or copper.

In some embodiments, the restriction component surrounds the at least one conductive component, and an orthographic projection of the restriction component on the driving substrate is a hollow closed pattern.

In some embodiments, the closed pattern is circular or rectangular, and the restriction component has a thickness in a range of about 0.2 microns to about 0.3 microns in a direction parallel to a plane in which the driving substrate is located.

In some embodiments, the at least one conductive component has a shape of pyramid.

In some embodiments, the at least one conductive component has a shape of cone.

In some embodiments, the driving substrate is provided with a plurality of driving transistors; each of the plurality of driving transistors includes a source, a drain, a gate, and an active layer, and the driving transistor is configured to control a corresponding driving electrode by its drain being coupled to the driving electrode.

In another aspect, a display device is provided to include the display backboard above and a plurality of micro light emitting diodes, wherein each of the plurality of micro light emitting diodes includes a first electrode and a second electrode, which are respectively coupled to two adjacent connection structures on the di splay backboard.

In some embodiments, the restriction components of the two adjacent connection structures are provided at least on opposite sides of the two adjacent connection structures.

In some embodiments, the plurality of micro light emitting diodes are arranged in an array of multiple rows and columns; the display backboard includes connecting structures of multiple rows and columns corresponding to the plurality of micro light emitting diodes; the restriction components of two adjacent connecting structures in a same column are at least provided on opposite sides of the two adjacent connecting structures; and the restriction components of two adjacent connection structures in a same row are at least provided on opposite sides of the two adjacent connection structures.

In another aspect, a method for manufacturing a display backboard is provided to include: forming a plurality of driving electrodes on a driving substrate; forming a connection structure on each of the plurality of driving electrodes, such that an orthographic projection of the connection structure on the driving substrate is within an orthographic projection of the corresponding driving electrode on the driving substrate, wherein the forming a connection structure on each of the plurality of driving electrodes includes: forming at least one conductive component on the driving electrode, such that an area of a first cross-section of the at least one conductive component is negatively correlated to a distance between the first cross-section and a surface of the driving substrate, and the first cross-section is parallel to the surface of the driving substrate; and forming a restriction component on a side of the at least one conductive component provided with the driving electrode and at least in a part of a peripheral region of the at least one conductive component, wherein the restriction component protrudes from the driving electrode and has a first height in a direction perpendicular to the driving substrate.

In some embodiments, the forming at least one conductive component on the driving electrode includes: forming a first photoresist pattern on the driving substrate provided with the driving electrode, to form a first via hole exposing the driving electrode at a position on the driving electrode where the at least one conductive component is to be formed; forming a metal pillar in the first via hole; forming a second photoresist pattern on the metal pillar such that the second photoresist pattern has a diameter smaller than that of the metal pillar; and performing an etching process on the metal pillar to form at least one conductive component by using the second photoresist pattern as a mask, wherein the forming a restriction component on a side of the at least one conductive component provided with the driving electrode and at least in a part of the peripheral region of the at least one conductive component includes: removing the first photoresist pattern and the second photoresist pattern; forming a restriction structure on the driving electrode at least in the part of the peripheral region of the at least one conductive component; depositing a metal material on an exposed sidewall of the restriction structure to form the restriction component at least in the part of the peripheral region of the at least one conductive component, wherein the forming a restriction structure on the driving electrode at least in the part of the peripheral region of the at least one conductive component includes: sequentially forming a planarization layer and a first metal layer on the driving substrate from which the first photoresist pattern and the second photoresist pattern are removed, such that a height of the planarization layer in a direction perpendicular to the driving substrate is greater than that of the at least one conductive component; forming a third photoresist pattern on the first metal layer, and performing an etching process on the first metal layer to form a first metal pattern; and performing an etching process on the planarization layer by using the first metal pattern as a mask, such that a surface of the at least one conductive component distal to the driving electrode and the exposed sidewall on which the restriction component is to be formed are exposed, thereby forming the restriction structure.

In some embodiments, the depositing a metal material on an exposed sidewall of the restriction structure to form the restriction component at least in the part of the peripheral region of the at least one conductive component includes: removing the third photoresist pattern, and forming a second metal layer on a sidewall of the planarization layer, a surface of the at least one conductive component distal to the driving electrode and the exposed driving electrode; coating a fourth photoresist layer on the entire surface of the driving substrate provided with the second metal layer; performing a plasma treatment on the fourth photoresist layer in an oxygen atmosphere to thin the fourth photoresist layer to a selected thickness, to expose an entire top surface of the second metal layer and a part of the side surface proximal to the top surface of the second metal layer, and to maintain the fourth photoresist covering the at least one conductive component or maintain a top of the at least one conductive component exposed by the fourth photoresist layer; and etching away a part of the second metal layer uncovered by the fourth photoresist layer and the first metal layer pattern such that the at least one conductive component is prevented from being etched, wherein a part of the second metal layer on the sidewall of the planarization layer and covered by the fourth photoresist layer functions as the restriction component.

BRIEF DESCRIPTION OF THE DRAWINGS

The drawings are used to provide a further understanding of the present disclosure, and constitute a part of the specification, together with the following specific embodiments to explain the present disclosure, but do not constitute a limitation of the present disclosure. In the drawings.

DETAILED DESCRIPTION

Figure 1A:
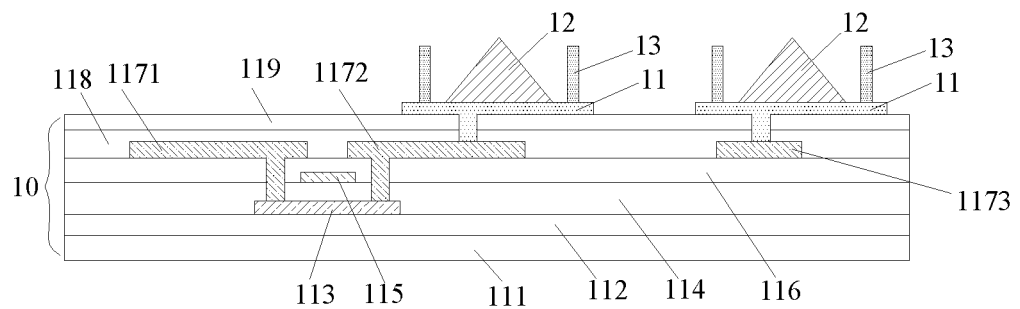
FIGS. 1a-1f are schematic diagrams of a structure of a display backboard according to an embodiment of the present disclosure.

The specific embodiments of the present disclosure will be described in detail below with reference to the drawings. It should be understood that the specific embodiments described herein are only used to illustrate and explain the present disclosure, and are not used to limit the present disclosure.

A size of each Micro-LED in a Micro-LED display device is typically less than or equal to 100 micrometers (μm). A distance between two adjacent Micro-LEDs in the Micro-LEDs arranged in an array is also in micrometer level. Therefore, how to improve bonding efficiency and reliability of the Micro-LED and the corresponding driving electrode in the display backboard has become a very important issue in the process of transferring each Micro-LED onto the display substrate.

For this purpose, according to one aspect of the present disclosure, a display backboard is provided. As shown in FIGS. 1a-1f, the display backboard includes: a driving substrate 10; a plurality of driving electrodes 11 on the driving substrate 10; and a plurality of connection structures respectively on the plurality of driving electrodes 11. An orthogonal projection of each of the plurality of connection structures on the driving substrate 10 is within an orthogonal projection of the corresponding driving electrode 11 on the driving substrate 10. The connection structure includes at least one conductive component 12 and a restriction component 13. The at least one conductive component 12 is provided on the driving electrode 11. An area of a first cross-section of the at least one conductive component 12 is negatively correlated to a distance between the first cross-section and a surface of the driving substrate 10. The first cross-section is parallel to the surface of the driving substrate. The restriction component 13 is on a side of the driving electrode 11 provided with the at least one conductive component 12 and at least in a part of peripheral region of the at least one conductive component 12. The restriction component 13 protrudes from the driving electrode 11 and has a first height in a direction perpendicular to the driving substrate 10. In some embodiments, an included angle between the restriction component 13 and a plane where the driving substrate 10 is located is in a range of 85° to 95°. In this case, the restriction component 13 can also be considered to be almost perpendicular to the driving substrate 10.

Figure 4:
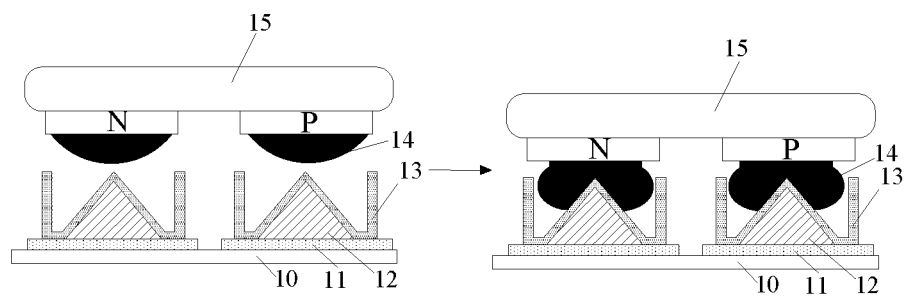
FIG. 4 is a schematic diagram of bonding an LED chip to a connection structure according to an embodiment of the present disclosure.

The display backboard of the present disclosure includes a plurality of connection structures, and each connection structure is configured to be coupled to an electrode pin of an electronic device for controlling the electronic device. The connection structure in the display backboard of the present disclosure includes a conductive component for an electrical connection and a restriction component. The conductive component is made of a conductive material to be electrically coupled to an electrode pin of an electronic device. The restriction component is provided in the periphery of the conductive component and restricts a bonding material for electrically coupling the conductive component to the pin of the electronic device. When the conductive component on the display backboard is electrically coupled to the electrode pin of the electronic device (e.g., a Micro-LED) by the above configuration, the bonding material is blocked by the restriction component and is restricted in a predetermined area without overflowing, such that a short circuit can be avoided, as shown in FIG. 4.

Figure 1B:
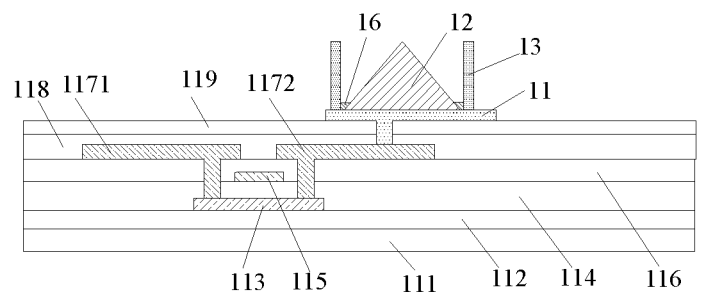
Figure 1C:
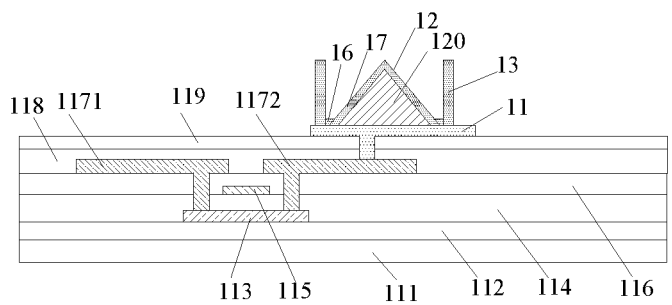
Figure 1D:
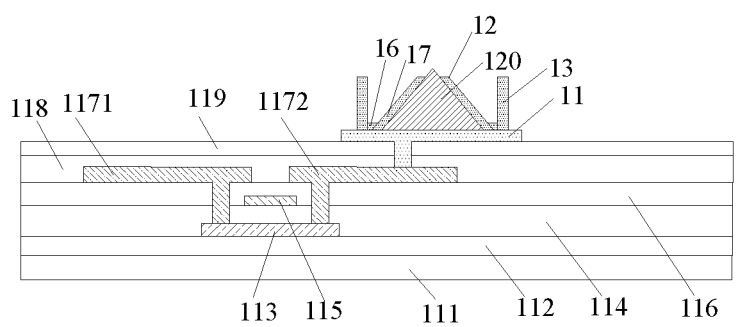
Figure 1E:
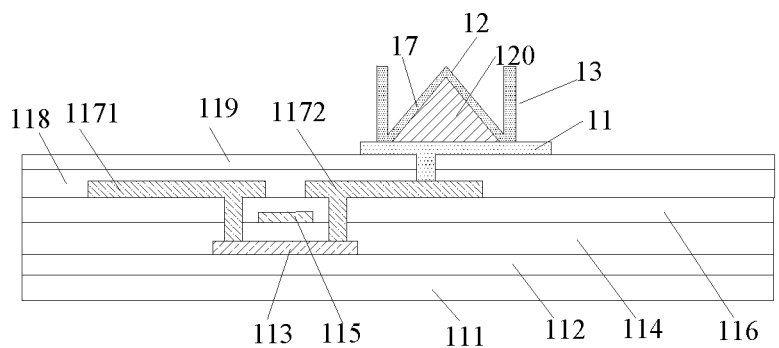
Figure 1F:
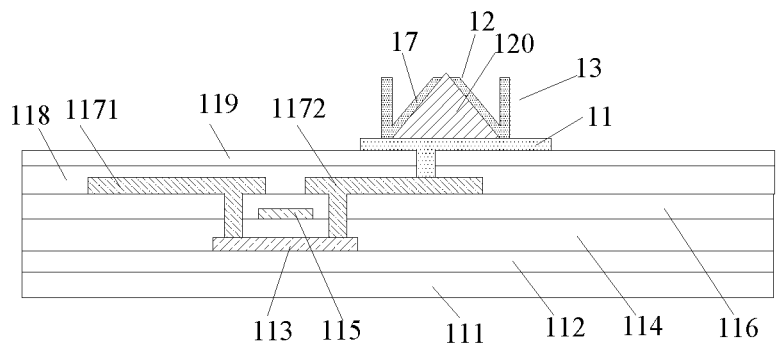
Figure 2A:
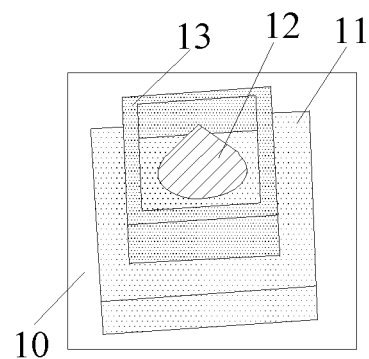
FIGS. 2a-2h are schematic diagrams of a connection structure according to an embodiment of the present disclosure.
Figure 2A:
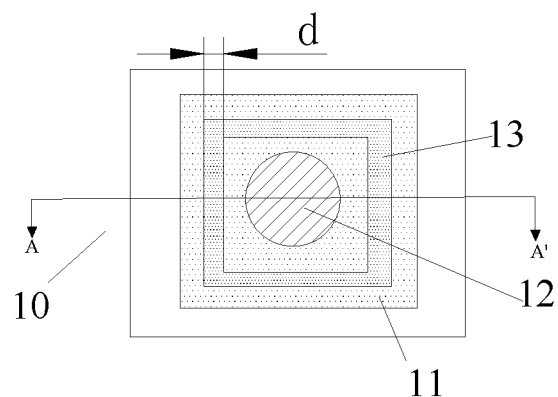
Figure 2B:
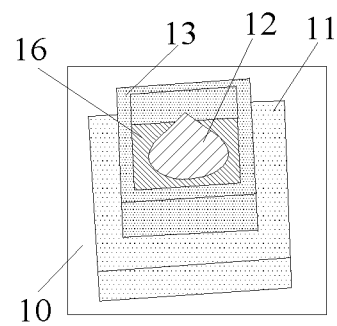
Figure 2B:
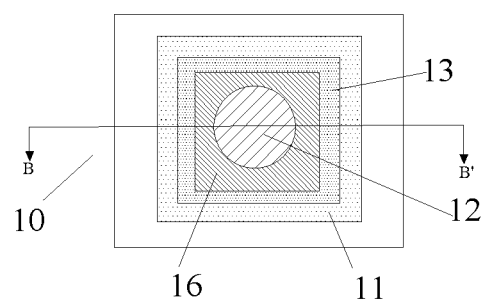
Figure 2C:
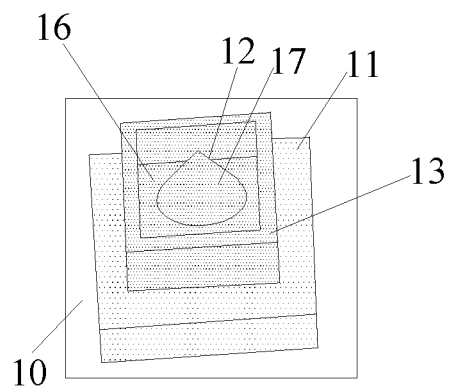
Figure 2C:
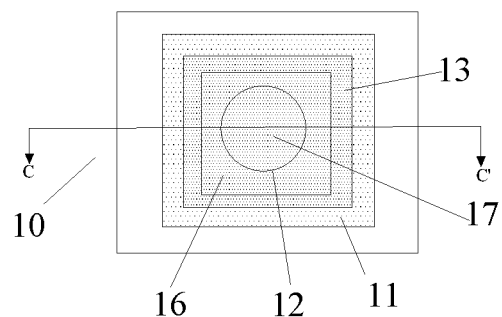
Figure 2D:
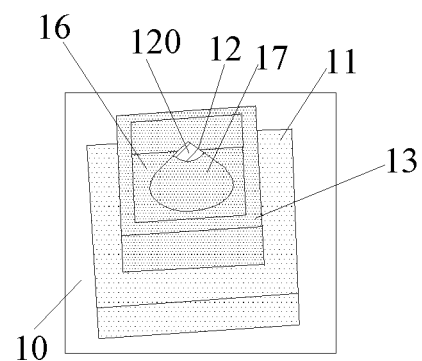
Figure 2D:
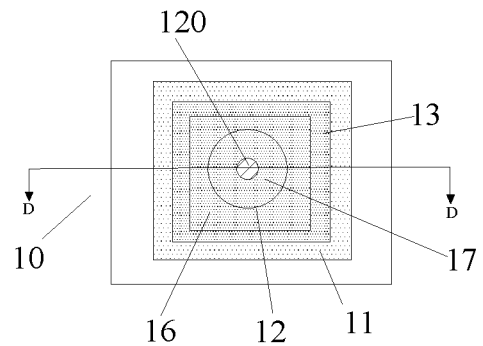
Figure 2E:
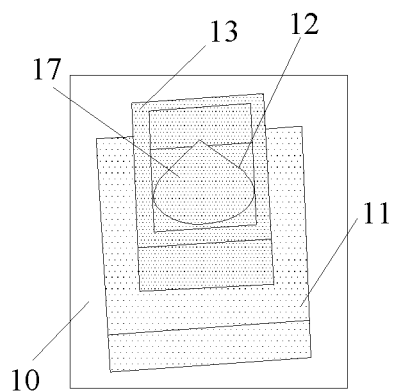
Figure 2E:
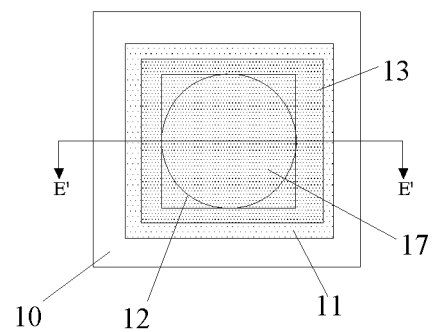
Figure 2F:
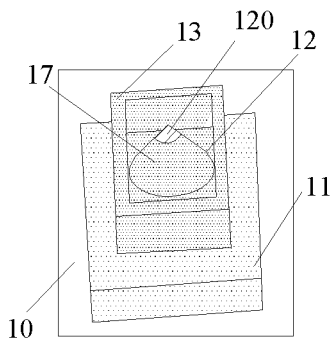
Figure 2F:
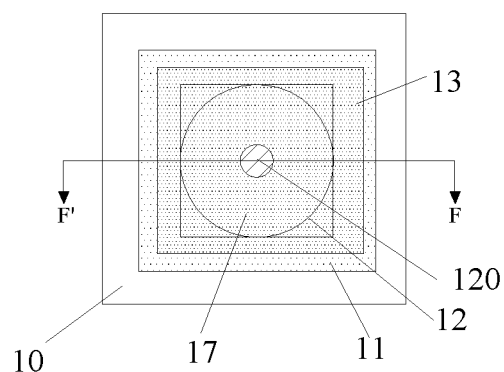

The at least one conductive component 12 on the driving electrode 11 may include one or more conductive components 12. FIGS. 2a, 2b, 2c, 2d, 2e, and 2f each are a perspective view of a restriction component 13 surrounding one conductive component 12. FIGS. 2a', 2b', 2c', 2d', 2e', and 2f' are top views of FIGS. 2a, 2b, 2c, 2d, 2e, and 2f, respectively. FIGS. 1a, 1b, 1c, 1d, 1e, and 1f are cross-sectional views of FIGS. 2a', 2b', 2c', 2d', 2e', and 2f along lines A-A', B-B', C-C', D-D', E-E', and F-F', respectively. FIGS. 3a, 3b, 3c, and 3d each are perspective views of a restriction component 13 surrounding three conductive components 12. Of course, the number of conductive components 12 surrounded by the restriction component 13 can be set as required The fact that the orthographic projection of each of the plurality of connection structures on the driving substrate 10 is located within the orthographic projection of the corresponding driving electrode 11 on the driving substrate 10 means that the orthographic projection of each of the connection structures on the driving substrate 10 substantially entirely falls into the orthographic projection of the corresponding driving electrode 11 on the driving substrate 10; or the orthographic projection of each of the connection structures on the driving substrate 10 at least partially falls into the orthographic projection of the corresponding driving electrode 11 on the driving substrate 10, and there is a partial overlap between the orthographic projections of each of the connection structures and of the corresponding driving electrode 11.

Figure 2G:
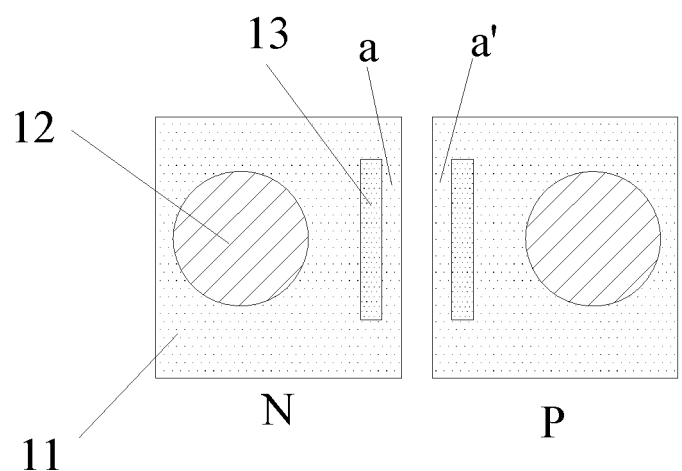

The fact that the restriction component 13 is located in at least a part of the peripheral region of the at least one conductive component 12 means that the restriction component 13 is provided at least in a part of the peripheral region of the conductive component 12. For example, as shown in FIG. 2g, in two adjacent connection structures corresponding to two electrodes (P and N) of an LED chip 15, the restriction components 13 of the two connection structures are only provided on opposite sides of the two adjacent connection structures, so as to avoid a short circuit caused by a contact of the overflowed bonding material when bonding the two electrodes. For example, when the driving electrode 11 has a shape of a rectangle and the conductive component 12 provided on the driving electrode has a shape of cone, the restriction component 13 may be a columnar protrusion provided only on one edge side of the rectangle. FIG. 2g shows that the restriction components 13 of two adjacent connecting structures are respectively columnar protrusions on the adjacent edges of the two adjacent driving electrodes, which are similar to two dams. During bonding, the two retaining walls restrict the bonding material corresponding to the two electrodes on the respective driving electrodes without laterally overflowing onto the adjacent driving electrodes, so as to effectively avoid short circuit caused by undesired bonding material contact. As shown in FIG. 2g, the restriction component 13 should have a size in a direction perpendicular to an arrangement direction of two adjacent driving electrodes, which is generally equal to or greater than a size of the conductive component in a direction perpendicular to the arrangement direction to effectively realize bonding isolation.

Figure 2H:
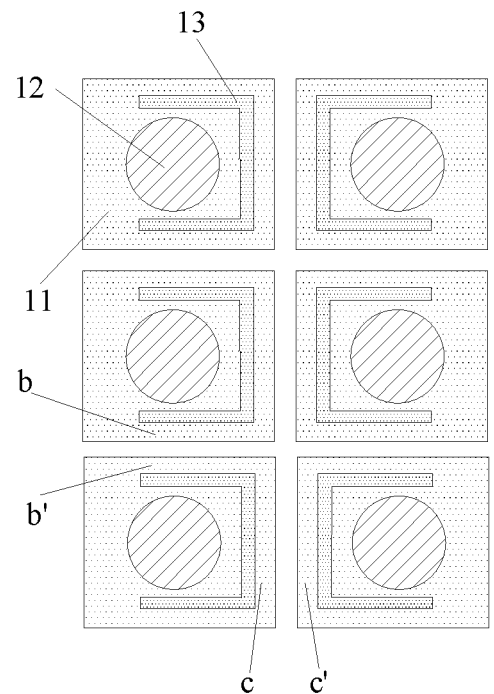
Figure 3A:
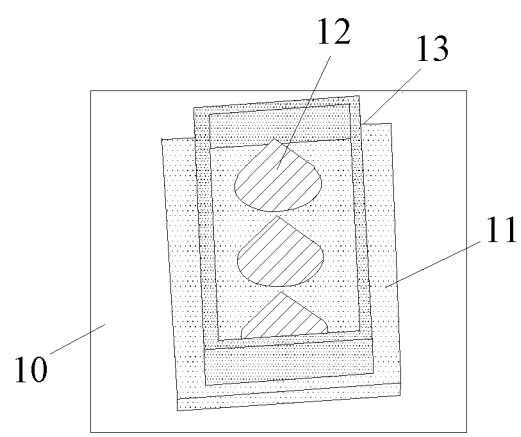
FIGS. 3a-3d are schematic diagrams of a connection structure according to an embodiment of the present disclosure.
Figure 3B:
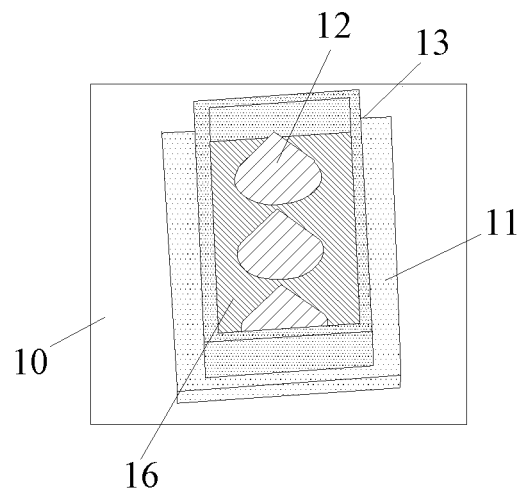
Figure 3C:
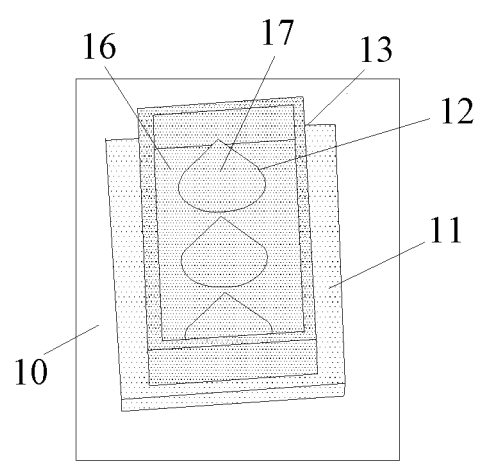
Figure 3D:
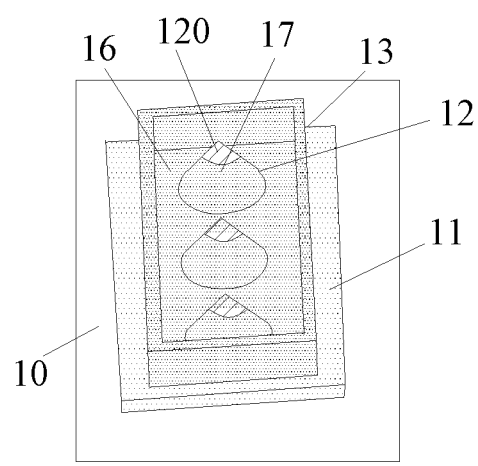

Optionally, as shown in FIG. 2h, for the driving electrodes arranged in multiple rows, it also takes into consideration of a bonding isolation between the electrodes of two LED chips adjacent in a column direction when the connection structures are provided on the driving electrodes. At this time, as shown in FIG. 2h, the restriction components of the connection structures are provided not only on the opposite sides of the connection structures adjacent in the row direction but also on the opposite sides of the connection structures adjacent in the column direction. In FIG. 2h, the restriction component 13 includes three parts on three edges of a rectangular driving electrode, which semi-encloses the conductive component therein. The three parts may be coupled end to end, as shown in FIG. 2h. Optionally, the three parts may not be in contact with each other but isolated from each other. As described above, the restriction component 13 is a protrusion extruding from the surface of the driving electrode and having a first height. There is a gap between the restriction component and the conductive component inside the restriction component, which can be used to contain the bonding material during bonding. The bonding material for each electrode is restricted in the gap formed by its corresponding connecting structure, thereby avoiding an undesired short circuit due to overflowing of the bonding material to the adjacent connecting structure in the row direction or the column direction.

Of course, as shown in FIGS. 2a', 2b', 2c', 2d', 2e' and 2f', the restriction component may be provided around the entire periphery of the at least one conductive component 12, resulting in a best bonding isolation. The structures shown in FIGS. 2h and 2g occupy less area of the surface of the driving electrode.

A driving transistor is provided on the driving substrate 10, and is coupled to the driving electrode 11 for supplying an electric signal to the driving electrode. Specifically, in some embodiments, as shown in FIGS. 1a to 1f, the driving substrate 10 includes a base 111; a buffer layer 112 on the base 111; an active layer 113 on the buffer layer 112; a gate insulating layer 114 on the active layer 113 and on the buffer layer 112; a gate 115 on the gate insulating layer 114 corresponding to the active layer 113; a dielectric layer 116 on the gate 115 and the gate insulating layer 114; a source 1171 and a drain 1172 on the dielectric layer 116, which are coupled to the active layer 113 through via holes in the gate insulating layer 114 and the dielectric layer 116, respectively; a planarization layer 118 on the source 1171, the drain 1172, and the dielectric layer 116; and a passivation layer 119 on the planarization layer 118. The driving electrode 11 is coupled to the drain 1172 through the via hole in the planarization layer 118 and the passivation layer 119. In the embodiment, the driving transistor is a top gate transistor. The present application is not limited thereto, and a bottom gate transistor may be used. Of course, the driving electrodes 11 may be provided on other types of substrates as required.

As shown in FIG. 4, when the LED chip 15 is bonded by the bonding material 14 by using the connection structure of the present disclosure, the LED chip 15 may be bonded to the driving substrate 10 by using the combined structure of the conductive component 12 and the restriction component 13 of the present disclosure. First, the top of the conductive component 12 is aligned with the bonding material 14 at the position of the electrodes (P and N) of the LED chip 15 in a vertical direction. The bonding material 14 is usually a soft metal such as indium or tin, and the bonding material 14 is usually prepared on the LED chip 15 by thermal evaporation. Then, the top of the conductive component 12 is penetrated into the bonding material 14 at the position of electrode (P and N) of the LED chip 15. After the top of the conductive component 12 is penetrated into the bonding material 14, the bonding material 14 overflows laterally and spreads to the periphery of the top of the conductive component 12. The spreading bonding material 14 is blocked by the restriction component 13 and enters the gap formed by the conductive component 12 and the restricting component 13. Then, a low-temperature treatment (for example, a low-temperature treatment for 50 minutes) is performed in a vacuum atmosphere at a temperature of about 200° C. below a melting point of the metal of the bonding material 14, such that an inter-diffusion between the metal in the bonding material 14 and the metal in the conductive component 12 and the restriction component 13 occurs. Due to the presence of the restriction component 13, the bonding materials 14 at the positions of the N electrode and the P electrode of the LED chip 15 can be prevented from contacting each other when a lateral overflow of the bonding material 14 occurs, thereby preventing a short circuit from occurring between the N electrode and the P electrode of the LED chip 15. In this way, even if the pitch between the pins of the two electrodes of each LED chip 15 or the electrodes of the two adjacent LED chips 15 is very small, the bonding material 14 can be restricted by the restriction component and the conductive component of the connection structure in the embodiment of the present application, and no overflow occurs, thereby solving the problem of bonding short circuit due to a small pitch. Therefore, the connection structure of the present disclosure is particularly suitable for micro light emitting diodes.

In some embodiments, a difference between a second height of the conductive component 12 in a direction perpendicular to the driving substrate 10 and the first height of the restriction component 13 in the direction perpendicular to the driving substrate 10 is in a range from about 0 micrometers to about 1.5 micrometers. As shown in FIGS. 1b, 1c, and 1e, the second height of the conductive component 12 is equal to the first height of the restriction component 13. As shown in FIGS. 1a, 1d, and 1f, the second height of the conductive component 12 is greater than the first height of the restriction component 13. In some examples, the height of the conductive component 12 may be in a range of 2.8 to 3.5 micrometers, and the height of the restriction component 13 may be in a range of 2.0 to 2.5 micrometers. In one specific example, the height of the conductive component 12 may be 3.0 micrometers, and the height of the restriction component 13 may be 2.2 micrometers.

In some embodiments, the restriction component 13 may be made of a conductive material just like the conductive component 12, such that both the surface of the conductive component 12 and the surface of the restriction component 13 can be in electrical contact with the bonding material 14, thereby increasing the electrical contact area, reducing the resistance, and reducing the power consumption. However, the present application is not limited thereto, and the restriction component 13 introduced in the present application is intended to avoid short circuit between the bonding materials corresponding to the adjacent connecting structures, and all structures that restrict the overflow of the bonding materials therein are within the scope of the present application. For example, the restriction component 13 is not limited to being made of a conductive material, but may be made of an insulating material, in which case the restriction component 13 is only used to avoid short circuit between the bonding materials corresponding to the adjacent connection structures and cannot affect the electrical connection of the driving electrodes 11 and the electrodes (P and N) of the LED chip 15.

In some embodiments, the conductive component 12 is spaced apart from the restriction component 13. As shown in FIGS. 1a to 1d, the conductive component 12 is not in contact with the restriction component 13 on the surface of the driving electrode 11.

In some embodiments, the connection structure further includes a conductive connection component 16 on the driving electrode 11 and between the conductive component 12 and the restriction component 13. As shown in FIG. 1b, the conductive component 12 and the restriction component 13 are coupled to each other on the surface of the driving electrode 11 by a conductive connection component 16. In this case, the restriction component 13, the conductive connection component 16 and the conductive component 12 may be made of a same conductive material. Optionally, the restriction component 13, the conductive connection component 16 and the conductive component 12 may be integrally made of a same conductive material, resulting in a simple manufacturing process.

In some embodiments, the conductive component 12 includes a main body 120 on the driving electrode 11 and a conductive layer 17 covering the entire surface of the main body, as shown in FIG. 1c. The conductive connection component 16, the restriction component 13, and the conductive layer 17 may be made of a same conductive material. In this case, the main body 120 may be made of a non-conductive material, and the conductive connection component 16, the restriction component 13, and the conductive layer 17 may be simultaneously manufactured in one process.

In some embodiments, the conductive component 12 includes a main body 120 on the driving electrode 11 and a conductive layer 17 covering the entire surface of the main body 120 except for a part of the surface (e.g., the part of the tip end of the main body 120) distal to the driving electrode 11, as shown in FIG. 1d. In this case, the main body 120 may be made of a conductive material to increase an electrical contact area with the bonding material and reduce contact resistance. The conductive connection component 16, the restriction component 13 and the conductive layer 17 may be made of a same conductive material. Optionally, the restriction component 13, the conductive connection component 16 and the conductive layer 17 may be integrally formed by a same conductive material, resulting in a simple manufacturing procedure. For example, the height of the conductive layer 17 in a direction perpendicular to the driving substrate may be approximately equal to the first height.

In some embodiments, the conductive component 12 and the restriction component 13 may be in direct contact on the surface of the driving electrode 11. In some embodiments, the conductive component 12 may include a main body 120 on the driving electrode 11 and a conductive layer 17 covering the entire surface of the main body, as shown in FIG. 1e. Optionally, the conductive component 12 includes a main body 120 on the driving electrode 11 and a conductive layer 17 covering the surface of the main body 120 except for a part of the surface (e.g., a surface of a tip end of the main body 120) distal to the driving electrode 11, as shown in FIG. 1f. The restriction component 13 and the conductive layer 17 may be made of a same conductive material. The height of the conductive layer 17 in FIG. 1e in a direction perpendicular to the driving substrate 10 is equal to the first height, i.e. the height of the overall conductive component 12 is the height of the conductive layer 17 in the direction perpendicular to the driving substrate 10. The height of the conductive layer 17 in FIG. 1f in the direction perpendicular to the driving substrate 10 is approximately equal to the first height, i.e. the height of the entire conductive component 12 is greater than the first height.

In some embodiments, a material of the main body 120 is copper, aluminum or nickel, and a material of the conductive layer 17 is molybdenum or copper. Of course, other materials may be selected as desired to prepare the corresponding main body and conductive layer. For example, as described above, when the conductive layer is provided on the entire surface of the conductive component 12, the main body inside the conductive layer may be made of a non-conductive material.

The materials of the main body, the conductive layer, and the restriction component are not limited in the present application as long as the prepared connection structure can satisfy the required strength and conductivity.

In some embodiments, when the restriction component 13 surrounds the at least one conductive component 12, the orthographic projection of the restriction component 13 on the driving substrate may be a closed pattern. In a specific example, the closed pattern is a hollow circular or rectangular shape, such as a tubular structure, e.g. a circular or square tube, as shown in FIGS. 2a'-2f'. And, a thickness d of the restriction component 13 in a direction parallel to the plane where the driving substrate 10 is located is in a range of about 0.2 micrometers to about 0.3 micrometers, as shown in FIG. 2a'.

In some embodiments, the conductive component 12 has a shape of pyramid. For example, as shown in FIGS. 2a-3d, the horizontal cross-section of the conductive component 12 is circular, i.e. the conductive component 12 has a shape of cone. However, the present disclosure is not limited thereto, and the conductive component 12 may also be another type of pyramid whose cross-section in a horizontal direction is rectangular, triangular, or the like.

Figure 5:
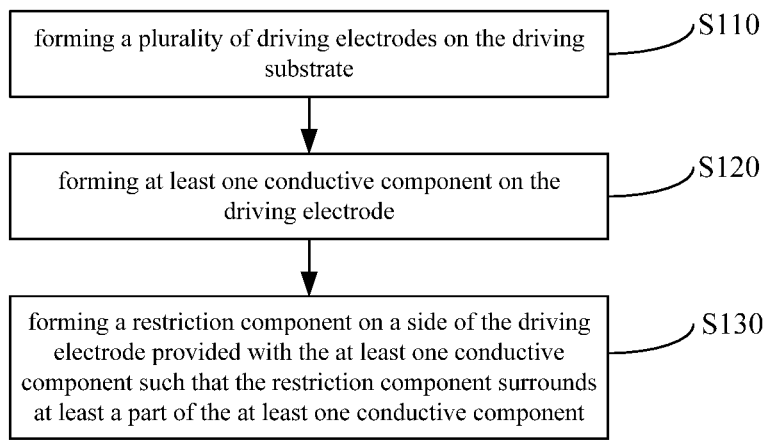
FIG. 5 is a flow chart of a method for manufacturing a display backboard according to an embodiment of the present disclosure.

According to one aspect of the present disclosure, there is provided a method for manufacturing the above-described display backboard. As shown in FIG. 5, the method includes the following steps S110, S120, and S130.

In step S110, a plurality of driving electrodes 11 are formed on the driving substrate 10.

Figure 7A:
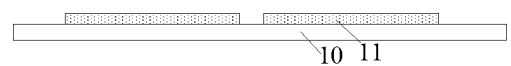
FIGS. 7a-7m' are schematic diagrams of structures corresponding to respective steps of a method for manufacturing a display backboard according to an embodiment of the disclosure.

For example, as shown in FIG. 7a, an electrode layer is formed on the driving substrate 10 by sputtering or deposition, and then is patterned to form a plurality of driving electrodes 11.

FIG. 7a only schematically shows the driving substrate 10. As shown in FIG. 1a, the driving transistor and the electrode wire are formed on the driving substrate 10. The drain of the driving transistor and the electrode wire are respectively coupled to the driving electrodes formed on the surface of the driving substrate 10 through a conductive material in via holes.

In step S120, at least one conductive component 12 is formed on the driving electrode 11. The area of a first cross-section of the at least one conductive component 12 is negatively correlated to a distance between the first cross-section and the surface of the driving substrate 10. The first cross-section is parallel to the surface of the driving substrate 10.

In step S130, the restriction component 13 is formed on a side of the driving electrode 11 provided with the at least one conductive component 12 to surround at least a part of the at least one conductive component 12. The restriction component 13 protrudes from the driving electrode 11 and has a first height in a direction perpendicular to the driving substrate 10.

The conductive component 12 and the restriction component 13 formed as described above are provided as a connection structure on the corresponding driving electrode, and the orthographic projection of the whole connection structure on the driving substrate is within the orthographic projection of the driving electrode on the driving substrate.

Figure 6:
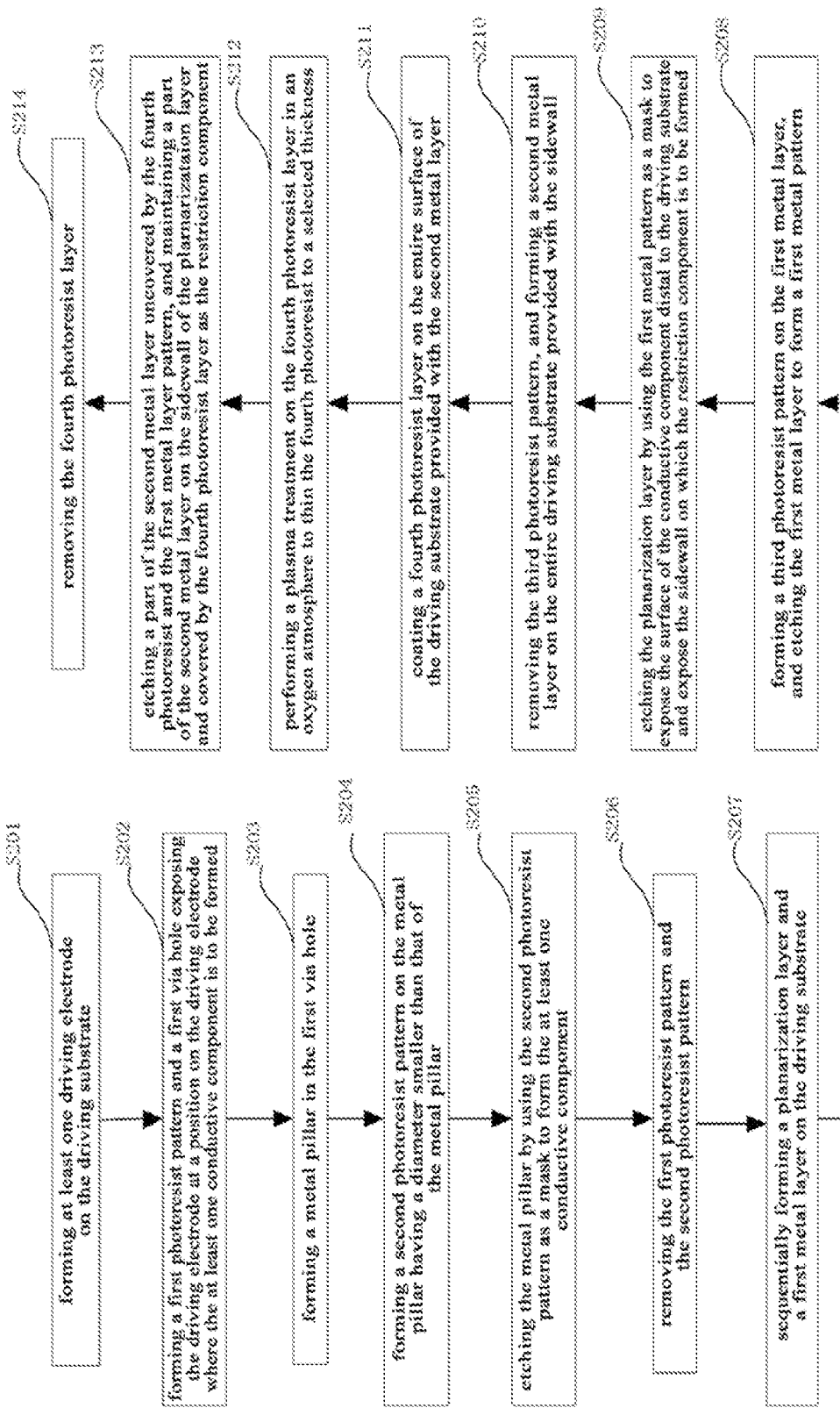
FIG. 6 is a process flow chart of a method for manufacturing a display backboard according to an embodiment of the present disclosure.

FIG. 6 is a diagram illustrating a process flow of a method for manufacturing a display backboard according to an embodiment of the disclosure, and FIGS. 7a to 7m' are schematic diagrams of structures obtained at various steps in the process flow of the method for manufacturing the display backboard according to an embodiment of the disclosure. The method for manufacturing the display backboard shown in FIG. 5 will be described in detail with reference to FIGS. 6 and 7a to 7m'.

In one embodiment, the method for manufacturing a display backboard of the present application includes steps S201 to S214.

In step S201, at least one driving electrode 11 is formed on the driving substrate 10, as shown in FIG. 7a.

Figure 7B:
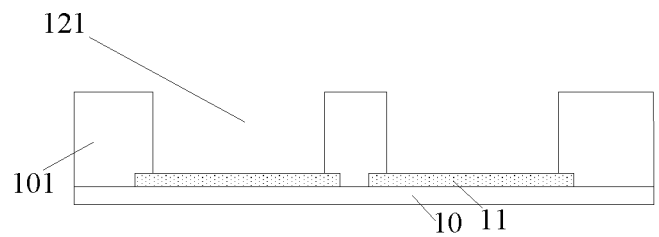

In step S202, a first photoresist pattern 101 is formed on the driving substrate 10 on which the at least one driving electrode 11 is formed, to form a first via hole 121 exposing the driving electrode 11 at a position on the driving electrode 11 where at least one conductive component 12 is to be formed. Specifically, first, a photoresist layer is coated on the entire driving substrate 10 on which the at least one driving electrode 11 is formed, and the thickness of the photoresist layer may be determined by the height of the conductive component 12 to be formed. For example, the height of the conductive component 12 to be formed is 3.0 μm, and the thickness of the photoresist layer may be 3.0 μm. Then, the photoresist layer is subjected to an exposure process and a development process to form a first photoresist pattern 101, such that a first via hole 121 exposing the driving electrode 11 is formed at a position on the driving electrode 11 where the at least one conductive component 12 is to be formed, as shown in FIG. 7b.

Figure 7C:
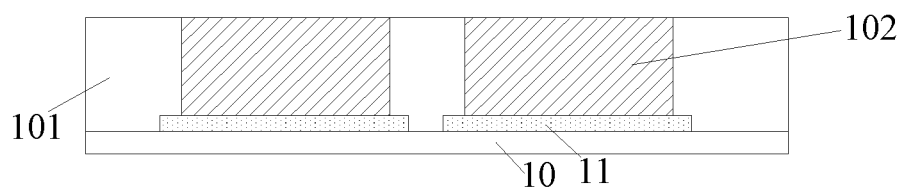

In step S203, a metal pillar 102 is formed in the first via hole 121. Specifically, as shown in FIG. 7c, the metal pillar 102 may be formed on the exposed part of the driving electrode 11 (i.e., in the first via hole 121) by using an electroplating process. For example, Cu ions may be deposited by using an electroplating process to form a copper pillar, but the present disclosure is not limited thereto and other processes may be used to form a metal pillar of any other material (e.g., aluminum, nickel, etc.).

Figure 7D:
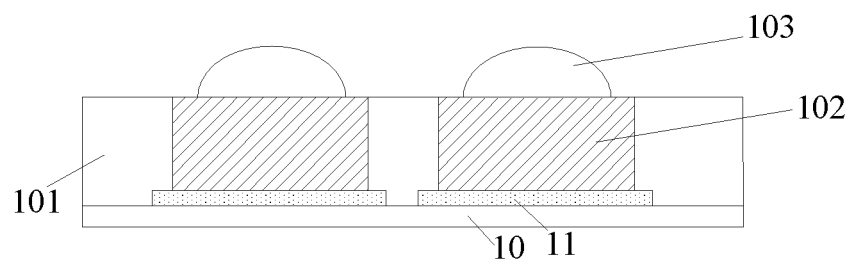

In step S204, a second photoresist pattern 103 having a diameter smaller than that of the metal pillar 102 is formed on the metal pillar 102. Specifically, as shown in FIG. 7d, a photoresist pattern is coated on the metal pillar 102, and the coated photoresist pattern has a size smaller than that of the metal pillar 102. That is, the photoresist pattern coated on the metal pillar 102 completely falls into the top surface of the metal pillar 102, and a center of the photoresist pattern coated on the metal pillar 102 and a center of the top surface of the metal pillar may be on a same vertical line. For example, if the coated photoresist pattern and the metal pillar 102 are both polygons similar to each other, the length of the diagonal line of the coated photoresist pattern is smaller than the length of the diagonal line of the metal pillar 102; if the coated photoresist pattern and the metal pillar 102 are both circular, the diameter of the coated photoresist pattern is smaller than the diameter of the metal pillar 102.

Figure 7E:
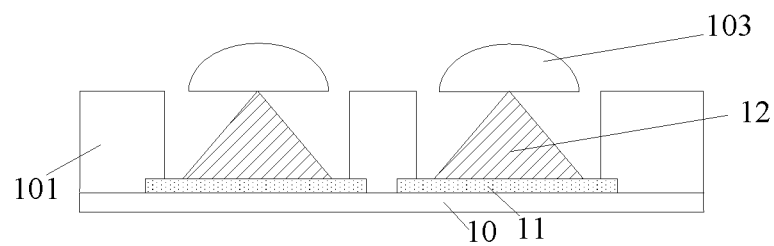

In step S205, the metal pillar 102 is etched by using the second photoresist pattern 103 as a mask to form the at least one conductive component 12. Specifically, the metal pillar 102 is etched by using a wet etching process and by using the second photoresist pattern 103 as a taper mask (spike mask) to obtain the conductive component 12, as shown in FIG. 7e.

Figure 7F:
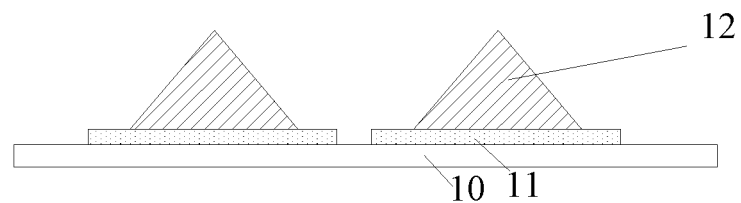

In step S206, the first photoresist pattern 101 and the second photoresist pattern 103 are removed, thereby forming the conductive component 12, as shown in FIG. 7f.

Figure 7G:
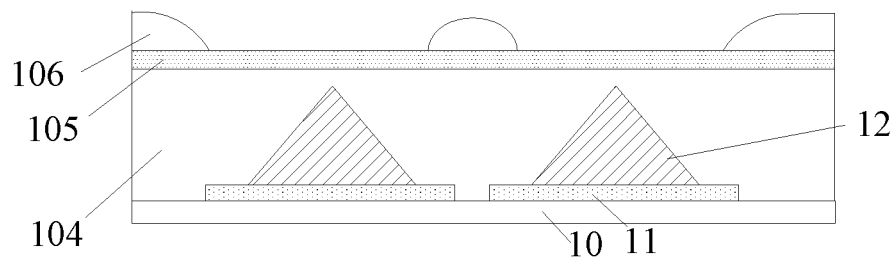

In step S207, a planarization layer 104 and a first metal layer 105 are sequentially formed on the driving substrate 10 from which the first and second photoresist patterns 101 and 103 are removed, and the height of the planarization layer 104 in a direction perpendicular to the driving substrate 10 is at least greater than the height of the conductive component 12. Specifically, a resin is first coated to form the planarization layer 104, and the thickness of the planarization layer 104 after being cured is ensured to be greater than the height of the conductive component 12. Then, a metal (e.g., molybdenum) is deposited on the planarization layer 104 to form the first metal layer 105, as shown in FIG. 7g.

In step S208, a third photoresist pattern 106 is formed on the first metal layer 105, and the first metal layer 105 is etched to form a first metal pattern 105'. Specifically, first, a photoresist layer is coated on the first metal layer 105, and is patterned to form the third photoresist pattern 106. Then, the first metal layer 105 is etched by using the third photoresist pattern 106 as a mask, thereby forming the first metal pattern 105', as shown in FIG. 7g.

Figure 7H:
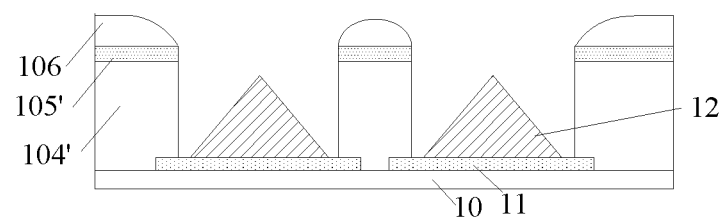

In step S209, the planarization layer 104 is etched by using the first metal pattern 105' as a mask to expose the entire surface of the conductive component 12 distal to the driving substrate 10 and expose the sidewall on which the restriction component is to be formed. Specifically, the planarization layer 104 may be etched by using the first metal pattern 105' as a hard mask to form a planarization layer pattern 104', thereby exposing substantially the entire surface of the conductive component 12 distal to the surface of the driving substrate 10, as shown in FIG. 7h. The planarization layer 104 and the first metal layer 105 form a restriction structure where they are etched, and the restriction structure is subsequently used to form the restriction component.

Figure 7I:
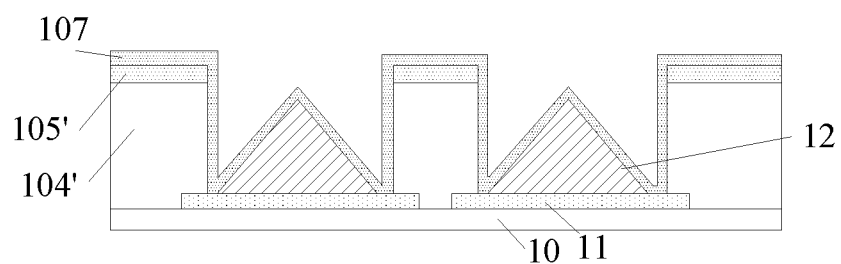

In step S210, the third photoresist pattern 106 is removed, and a second metal layer 107 is formed on the entire driving substrate 10. Specifically, a metal (e.g., molybdenum Mo) may be deposited by using a sputtering process to form a second metal layer 107 covering the entire surface of the driving substrate 10, as shown in FIG. 7i. The second metal layer 107 can then be used to form the restriction component 13, and the second metal layer 107 is required to have a thickness that is capable of maintaining a shape when the sidewall of a support on a back surface is removed. For example, when molybdenum is used to form the second metal layer 107, the thickness of the side wall (i.e., in a direction parallel to the plane where the driving substrate 10 is located) is required to be in a range of 0.2 to 0.3 μm.

Figure 7J:
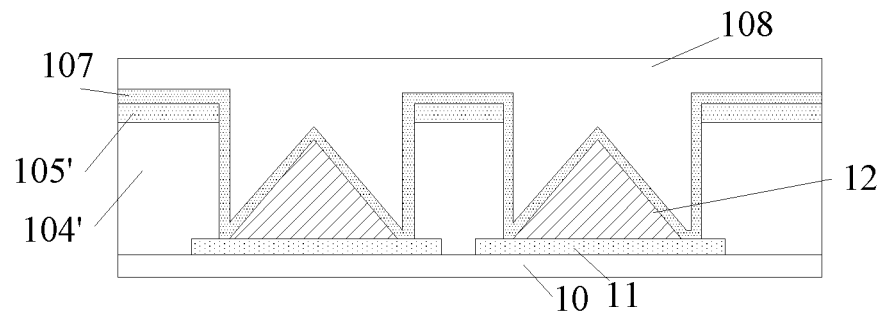

In step S211, a fourth photoresist layer 108 is coated on the entire surface of the driving substrate 10 on which the second metal layer 107 is provided, as shown in FIG. 7j.

In step S212, the fourth photoresist layer 108 is plasma-treated in an oxygen atmosphere to thin the fourth photoresist layer 108 to a selected thickness, so as to expose a part of the second metal layer 107, and the height of a thinned fourth photoresist pattern 108' is lower than that of the first metal layer pattern 105'.

Figure 7K:
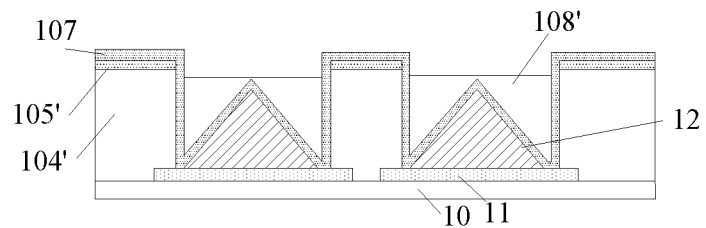

Specifically, the fourth photoresist layer 108 is directly subjected to a plasma treatment in an oxygen atmosphere to thin the thickness of the fourth photoresist layer 108. By controlling the time of the plasma treatment in the oxygen atmosphere and the ion concentration, the fourth photoresist pattern 108' having a selected thickness can be obtained. For example, after the fourth photoresist layer 108 is thinned, the top surface and a part of the side surface close to the top surface of the second metal layer 107 can be exposed, and it is also ensured that the height of the remaining fourth photoresist pattern 108' at the exposed position of the conductive component 12 is greater than the height of the conductive component 12, that is, the remaining fourth photoresist pattern 108' covers the conductive component 12, as shown in FIG. 7k. Optionally, in an embodiment, after the thickness of the fourth photoresist layer 108 is thinned, it is further ensured that the height of the conductive component 12 is greater than the thickness of the fourth photoresist pattern 108' remaining at the exposed position of the conductive component 12, i.e. the top of the conductive component 12 is exposed from the fourth photoresist pattern 108', as shown in FIG. 7k'.

Figure 7L:
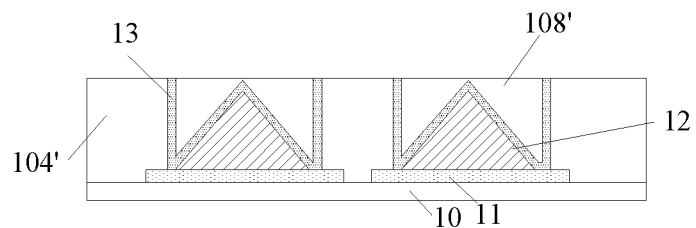

In step S213, the second metal layer 107 uncovered by the fourth photoresist pattern 108' and the first metal layer pattern 105' under the second metal layer 107 are etched away, and the second metal layer 107 at the sidewall covered by the fourth photoresist pattern 108' forms the restriction component 13. Specifically, the second metal layer 107 and the first metal layer pattern 105' that are not covered by the fourth photoresist pattern 108' may be removed by using a wet etching process, as shown in FIGS. 7l and 7l'. Since the fourth photoresist pattern 108' covers the second metal layer 107 at the sidewall, the height of the formed restriction component 13 is restricted by the thickness of the fourth photoresist pattern 108', i.e., the fourth photoresist pattern 108' achieves self-alignment of the restriction component 13 in height.

Figure 7M:
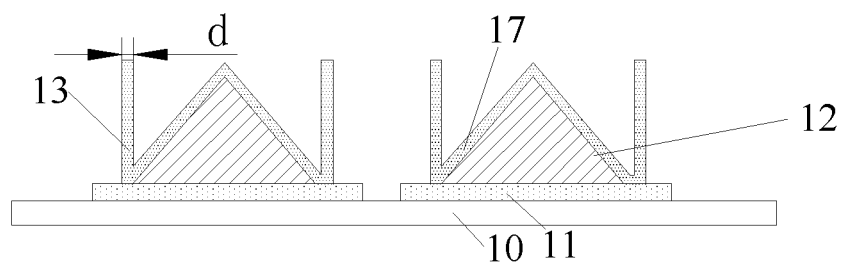
Figure 7K:
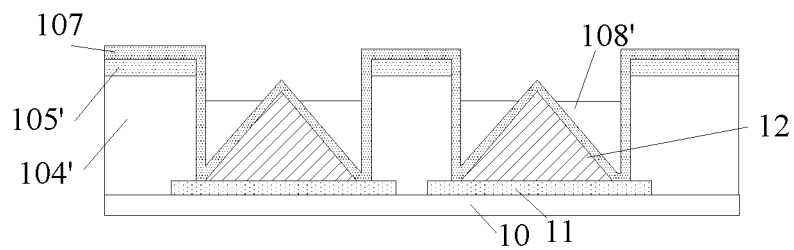
Figure 7L:
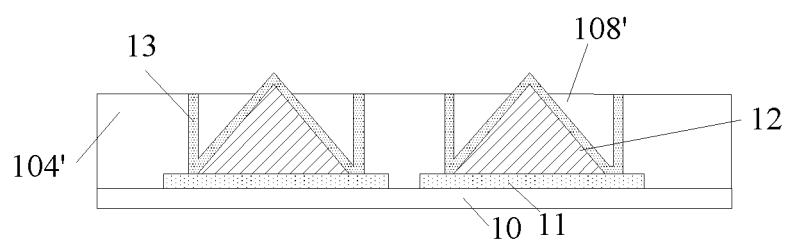
Figure 7M:
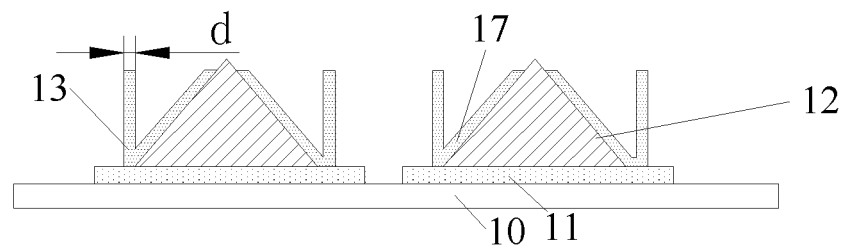

In step S214, the planarization layer 104 and the fourth photoresist layer 108 are removed to form a final connection structure. As shown in FIGS. 7m and 7m', the height of the restriction component 13 of the connection structure may be in a range of 2.0 to 2.5 µm, and the thickness d may be in a range of 0.2 to 0.3 µm; the height of the conductive component 12 may be in a range of 2.5 µm to 3.5 µm. For example, the height of the conductive component 12 may be 3.0 µm, and the height of the restriction component 13 may be 2.2 µm. As shown in FIG. 7m', the top of the conductive component 12 is exposed from the conductive layer 17, so that the conductive component 12 is in direct contact with for example the subsequent LED chip 5. Thus, when the conductive component 12 is made of copper, aluminum or the like, and the conductive layer 17 is made of molybdenum or the like, since the resistivity of copper or aluminum is smaller than that of molybdenum, the contact resistance between the LED chip 5 and the connection structure can be reduced.

In the connection structure of the display backboard formed by the above process, the second metal layer 107 formed between the restriction component 13 and the conductive component 12 may be used as a part of the conductive layer 17 or the conductive connection component 16 to connect the restriction component 13 and the conductive component 12 together, as shown in FIGS. 1b and 1c. Optionally, the second metal layer 107 may be deposited only on the above-mentioned sidewall, forming a connection structure as shown in FIG. 1a in which the restriction component 13 and the conductive component 12 are not connected to each other.

The present invention is not limited to the above-described manufacturing method, and for example, the restriction component 13 may be formed by using a non-conductive material, in which case the restriction component only plays a role of restricting the bonding material.

Figure 8A:
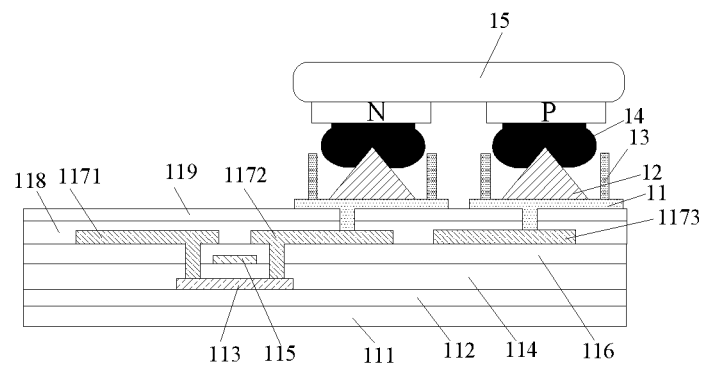
FIGS. 8a-8f are schematic diagrams of structures of display backboards according to some embodiments of the present disclosure, respectively.
Figure 8B:
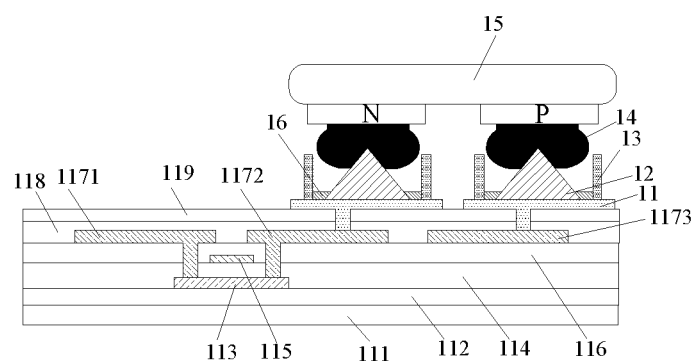
Figure 8C:
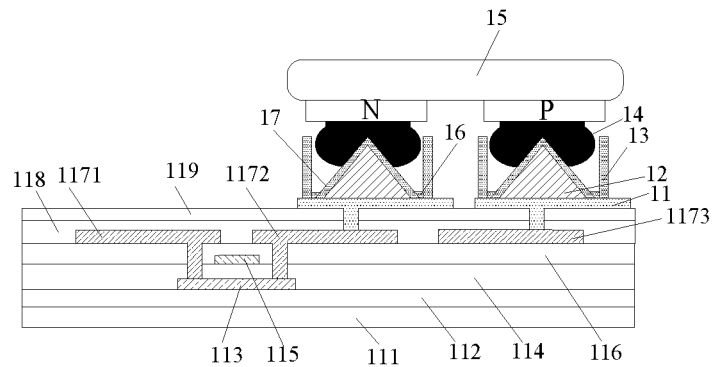
Figure 8D:
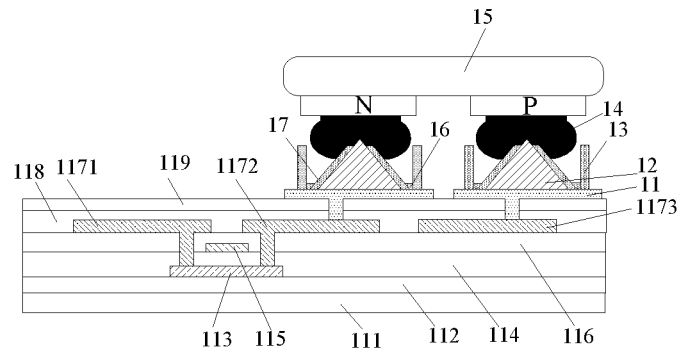
Figure 8E:
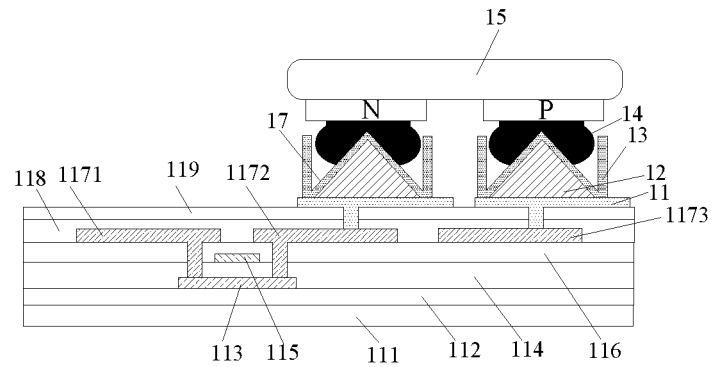
Figure 8F:
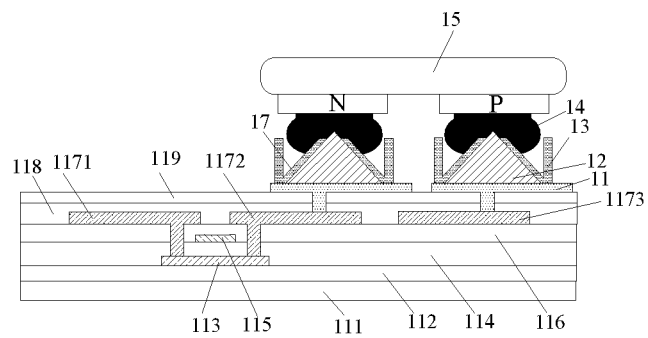

According to one aspect of the present disclosure, a display device is provided, which includes the above-mentioned display backboard and a plurality of micro light emitting diodes. As shown in FIG. 8a, each of the micro light emitting diodes includes a first electrode pin N drawn from an N region and a second electrode pin P drawn from a P region, i.e., a first electrode and a second electrode. The first and second electrodes are coupled to two connection structures on the display backboard by a bonding material 14, respectively, as shown in FIGS. 8a-8f. The display backboards in FIGS. 8a-8f correspond to the display backboards in FIGS. 1a-1f, respectively.

A plurality of pairs of driving electrodes are usually provided on the display backboard, and each pair of driving electrodes correspond to two electrode pins N and P of one micro light emitting diode, so as to ensure that each driving electrode can be electrically coupled to the corresponding electrode pin through the corresponding connecting structure. For example, the orthographic projections of the first electrode pin N and the second electrode pin P on the driving substrate are within the orthographic projection of the corresponding driving electrodes on the driving substrate.

In the embodiment, the first electrode pin N of the micro light emitting diode is electrically coupled to the drain 1172 of the transistor on the driving backboard by the bonding material 14, and the second electrode pin P is electrically coupled to the electrode wire 1173 on the driving backboard by the bonding material 14, such that the micro light emitting diode is controlled by the driving substrate. The electrode wire 1173 may be formed by a same one patterning process and by using a same material as the source 1171 and the drain 1172 of the driving transistor.

As shown in FIG. 8a, the conductive component 12 serving as an electrical contact in each connection structure is configured as a conical structure with a relatively sharp end, so that when bonding is performed, the conductive component can be effectively penetrated into the bonding material coated on the corresponding electrode pin to ensure a good electrical contact between the conductive component and the corresponding electrode pin. The bonding material expands toward the periphery after the electrical contact between the conductive component and the corresponding electrode pin occurs.

In some embodiments, the restriction component 13 of two adjacent connection structures are at least on opposite sides of the two adjacent connection structures, i.e. the orthographic projection of the restriction component 13 on the driving substrate is a non-closed pattern. For example, the restriction component 13 may be provided only on one side of the conductive component 12, that is, the restriction component 13 may be provided only at a position where an undesired short circuit of the bonding material may occur, as shown in FIG. 2g. In two adjacent connection structures, the restriction component is provided only on opposite sides (e.g., opposite sides of a and a') of the two adjacent connection structures for avoiding a short circuit of the bonding material between the two adjacent connection structures.

In some embodiments, a plurality of micro light emitting diodes are arranged in an array of multiple rows and columns. The restriction components of the connecting structures corresponding to two adjacent micro light emitting diodes on a same column each are located in the peripheral region of the at least one conductive component at least on two adjacent opposite sides of the adjacent micro light emitting diodes in the same column; and the restriction components of the connecting structures corresponding to two adjacent micro light emitting diodes on a same row each are located in the peripheral region of the at least one conductive component at least on two adjacent opposite sides of the two adjacent micro light emitting diodes in the same row. As shown in FIG. 2h, when the connection structures arranged in an array are included on the display backboard, the restriction components are only provided on two opposite sides (e.g., opposite sides b and b', c and c') of two adjacent connection structures in a same column or a same row for avoiding a short circuit of the bonding material between the adjacent connection structures.

In the present application, since the display device has the connection structure shown in the display backboard in FIGS. 1a to 1f. That is, the connection structure includes the conductive component 12 and the restriction component 13 in the periphery of the conductive component 12, and a gap is defined between the conductive component 12 and the restriction component 13. When a micro light emitting diode 15 is bound to the display backboard by a bonding material 14, the bonding material 14 is restricted inside the restriction component 13 by the restriction component 13, so that the bonding material 14 is prevented from overflowing, the problem of a bonding short circuit caused by a small pitch between electrodes can be solved, the contact area between the bonding electrodes can be increased, the resistance is reduced, and the power consumption is reduced.

It will be understood that, the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

What is claimed is:

1. A display backboard, comprising:
a driving substrate;
a plurality of driving electrode groups on the driving substrate, wherein each of the plurality of driving electrode groups comprises a plurality of driving electrodes to be coupled to an electronic device comprising a plurality of electrode pins, and the number of the plurality of driving electrodes is identical to the number of the plurality of electrode pins;
a plurality of connection structure groups, each of which comprises a plurality of connection structures, wherein each of the plurality of connection structures is on one of the plurality of driving electrodes of the connection structure group,
wherein the connecting structure comprises:
at least one conductive component on the driving electrode, wherein an area of a first cross-section of the at least one conductive component is negatively correlated to a distance between the first cross-section and a surface of the driving substrate, and the first cross-section is parallel to the surface of the driving substrate; and
a restriction component on a side of the driving electrode provided with the at least one conductive component and at least in a part of a peripheral region of the at least one conductive component, wherein the restriction component protrudes from the driving electrode and has a first height in a direction perpendicular to the driving substrate.

2. The display backboard of claim 1, wherein
the at least one conductive component comprises a plurality of conductive components; and
the plurality of conductive components are arranged in an array, and/or the plurality of conductive components have a same shape.

3. The display backboard of claim 1, wherein
the driving substrate is provided with a plurality of driving transistors;
each of the plurality of driving transistors comprises a drain, a source, a gate and an active layer; and
at least one driving electrode of the driving electrode groups is connected to at least one drain of at least one driving transistor of the plurality of driving transistors, respectively.

4. The display backboard of claim 1, wherein a difference between the first height and a second height of the at least one conductive component in a direction perpendicular to the driving substrate is in a range of about 0 microns to about 1.5 microns.

5. The display backboard of claim 1, wherein the restriction component is made of a conductive material.

6. The display backboard of claim 1, wherein the at least one conductive component is spaced from the restriction component.

7. The display backboard of claim 6, wherein the connection structure further comprises a conductive connection component on the driving electrode and between the at least one conductive component and the restriction component.

8. The display backboard of claim 7, wherein each of the at least one conductive component comprises a main body on the driving electrode, and a conductive layer covering an entire surface of the main body or covering an entire surface of the main body except for a part of the surface of the main body distal to the driving electrode; and
the conductive connection component, the restriction component, and the conductive layer are made of a same conductive material.

9. The display backboard of claim 1, wherein the at least one conductive component is in direct contact with the restriction component on a surface of the driving electrode.

10. The display backboard of claim 9, wherein each of the at least one conductive component comprises a main body on the driving electrode and a conductive layer covering an entire surface of the main body or covering an entire surface of the main body except for a part of the surface of the main body distal to the driving electrode; and
the restriction component and the conductive layer are made of a same conductive material.

11. The display backboard of claim 8, wherein a height of the conductive layer in a direction perpendicular to the driving substrate is approximately equal to a height of the restriction component in the direction perpendicular to the driving substrate.

12. The display backboard of claim 8, wherein a material of the main body is copper, aluminum, or nickel, and a material of the conductive layer is molybdenum or copper.

13. The display backboard of claim 1, wherein the restriction component surrounds the at least one conductive component, and an orthographic projection of the restriction component on the driving substrate is a hollow closed pattern.

14. The display backboard of claim 13, wherein the closed pattern is circular or rectangular, and the restriction component has a thickness in a range of about 0.2 microns to about 0.3 microns in a direction parallel to a plane in which the driving substrate is located.

15. The display backboard of claim 1, wherein the at least one conductive component has a shape of pyramid.

16. A display device, comprising the display backboard of claim 1 and a plurality of micro light emitting diodes, wherein
the plurality of connection structure groups are connected to the plurality of micro light emitting diodes, respectively.

17. The display device of claim 16, wherein
each of the plurality of micro light emitting diodes comprises a first electrode and a second electrode, the connection structure group connected to the micro light emitting diode comprises two connection structures, which are connected to the first electrode and the second electrode of the micro light emitting diode, respectively.

18. The display device of claim 17, wherein
of the two connection structures of the connection structure group connected to the micro light emitting diode, the restriction component of one connection structure of the two connection structures connected to the first electrode is closer to the other connection structure than the conducive component of the one connection structure; the restriction component of the other connection structure of the two connection structures connected to the second electrode is closer to the one connection structure than the conductive component of the other connection structure.

19. The display device of claim 18, wherein
the two connection structures of the connection structure group connected to the micro light emitting diode are arranged to be axially symmetrical with each other.

* * * * *